(12) United States Patent
Igarashi et al.

(10) Patent No.: US 12,193,340 B2
(45) Date of Patent: Jan. 7, 2025

(54) SWITCHING ELEMENT AND MEMORY DEVICE

(71) Applicant: Kioxia Corporation, Tokyo (JP)

(72) Inventors: Taichi Igarashi, Seoul (KR); Yuichi Ito, Seoul (KR); Eiji Kitagawa, Seoul (KR)

(73) Assignee: Kioxia Corporation, Tokyo (JP)

( * ) Notice: Subject to any disclaimer, the term of this patent is extended or adjusted under 35 U.S.C. 154(b) by 158 days.

(21) Appl. No.: 17/943,763

(22) Filed: Sep. 13, 2022

(65) Prior Publication Data

US 2023/0301205 A1 Sep. 21, 2023

(30) Foreign Application Priority Data

Mar. 18, 2022 (JP) ................. 2022-044327

(51) Int. Cl.

| | |
|---|---|
| *G11C 16/04* | (2006.01) |
| *G11C 11/16* | (2006.01) |
| *G11C 13/00* | (2006.01) |
| *H10B 61/00* | (2023.01) |
| *H10B 63/00* | (2023.01) |
| *H10N 50/10* | (2023.01) |

(Continued)

(52) U.S. Cl.
CPC ......... *H10N 70/043* (2023.02); *G11C 11/161* (2013.01); *G11C 13/0069* (2013.01); *H10B 61/00* (2023.02); *H10B 63/80* (2023.02); *H10N 50/10* (2023.02); *H10N 50/80* (2023.02); *H10N 70/826* (2023.02); *H10N 70/841* (2023.02); *H10N 70/882* (2023.02); *G11C 13/0004* (2013.01); *G11C 13/0007* (2013.01)

(58) Field of Classification Search
CPC ............ G11C 13/0069; G11C 13/0004; G11C 13/0007
See application file for complete search history.

(56) References Cited

U.S. PATENT DOCUMENTS

| | | | |
|---|---|---|---|
| 9,543,512 B2 * | 1/2017 | Ohba ................. | H10B 63/80 |
| 9,960,350 B2 | 5/2018 | Ha | |
| 10,566,054 B2 | 2/2020 | Nakazawa et al. | |

(Continued)

FOREIGN PATENT DOCUMENTS

| | | |
|---|---|---|
| JP | 2019169219 A | 10/2019 |
| JP | 2021144968 A | 9/2021 |

OTHER PUBLICATIONS

Baret, et al., "Silica-Based Oxide Systems: I. Experimental and Calculated Phase Equilibria in Silicon, Boron, Phosphorus, Germanium, and Arsenic Oxide Mixtures", Journal of the Electrochemical Society (vol. 138, No. 9), 1991, pp. 2830-2835, DOI: 10.1149/1.2086066.

(Continued)

*Primary Examiner* — Pho M Luu

(74) *Attorney, Agent, or Firm* — Holtz, Holtz & Volek PC

(57) ABSTRACT

A switching element includes a first electrode, a second electrode, and a switching material layer provided between the first electrode and the second electrode. The switching material layer contains silicon (Si), oxygen (O), arsenic (As), and a predetermined element selected from lead (Pb), silver (Ag), indium (In), tin (Sn), copper (Cu), zinc (Zn), gallium (Ga), germanium (Ge), selenium (Se), antimony (Sb), tellurium (Te), gold (Au) and bismuth (Bi).

10 Claims, 4 Drawing Sheets

(51) Int. Cl.
*H10N 50/80* (2023.01)
*H10N 70/00* (2023.01)

(56) References Cited

U.S. PATENT DOCUMENTS

| | | |
|---|---|---|
| 10,777,248 B1 * | 9/2020 | Mihajlovic ........... H01F 10/329 |
| 11,217,745 B2 | 1/2022 | Ito et al. |
| 11,329,215 B2 | 5/2022 | Sawada et al. |
| 11,348,973 B2 * | 5/2022 | Sharma ................ H10N 70/884 |
| 2021/0288253 A1 | 9/2021 | Kumura |
| 2022/0085103 A1 | 3/2022 | Yoshino et al. |
| 2022/0085278 A1 | 3/2022 | Igarashi |
| 2022/0093851 A1 | 3/2022 | Takehira et al. |

OTHER PUBLICATIONS

U.S. Appl. No. 17/684,736, First Named Inventor: Yuichi Ito; Title: "Memory Device"; filed Mar. 2, 2022.

* cited by examiner

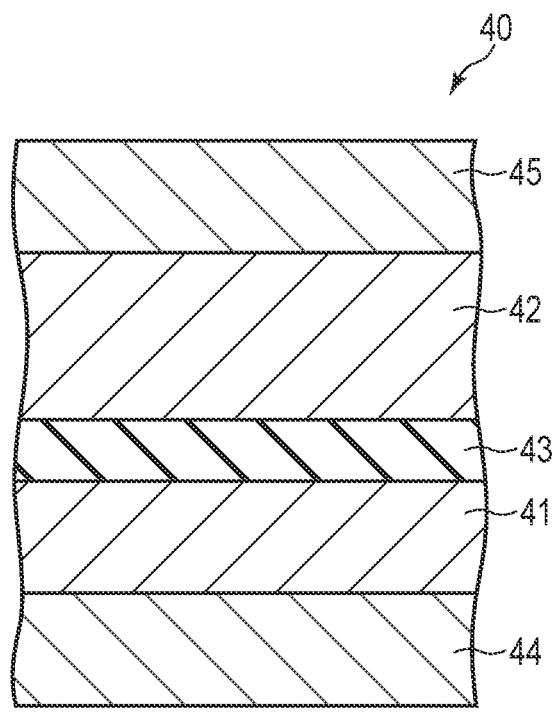
F I G. 2
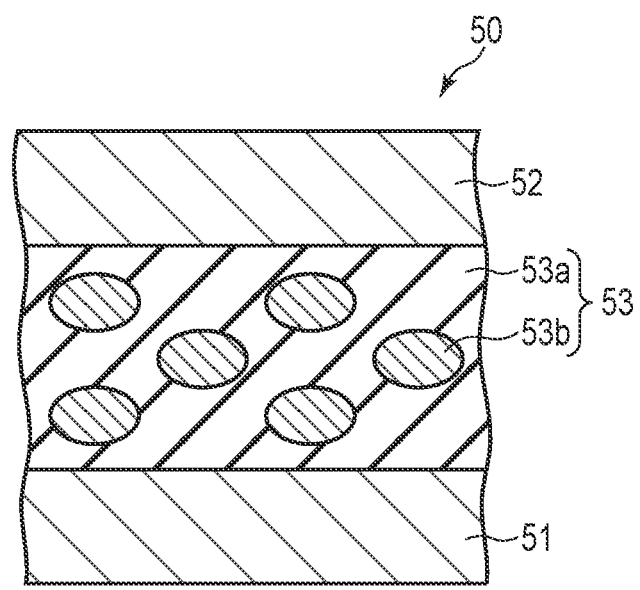
F I G. 3

SWITCHING ELEMENT AND MEMORY DEVICE

CROSS-REFERENCE TO RELATED APPLICATIONS

This application is based upon and claims the benefit of priority from Japanese Patent Application No. 2022-044327, filed Mar. 18, 2022, the entire contents of which are incorporated herein by reference.

FIELD

Embodiments described herein relate generally to a switching element and a memory device.

BACKGROUND

A memory device has been proposed in which memory cells including resistance change memory elements such as magnetoresistance effect elements and selectors (switching elements) are integrated on a semiconductor substrate.

BRIEF DESCRIPTION OF THE DRAWINGS

FIG. 2 is a cross-sectional view schematically showing a configuration of a magnetoresistance effect element of the memory device according to the embodiment.

FIG. 3 is a cross-sectional view schematically showing a configuration of a selector of the memory device according to the embodiment.

DETAILED DESCRIPTION

In general, according to one embodiment, a switching element includes: a first electrode; a second electrode; and a switching material layer provided between the first electrode and the second electrode, wherein the switching material layer contains silicon (Si), oxygen (O), arsenic (As), and a predetermined element selected from lead (Pb), silver (Ag), indium (In), tin (Sn), copper (Cu), zinc (Zn), gallium (Ga), germanium (Ge), selenium (Se), antimony (Sb), tellurium (Te), gold (Au) and bismuth (Bi).

Embodiments will be described hereinafter with reference to the accompanying drawings.

Figure 1A:
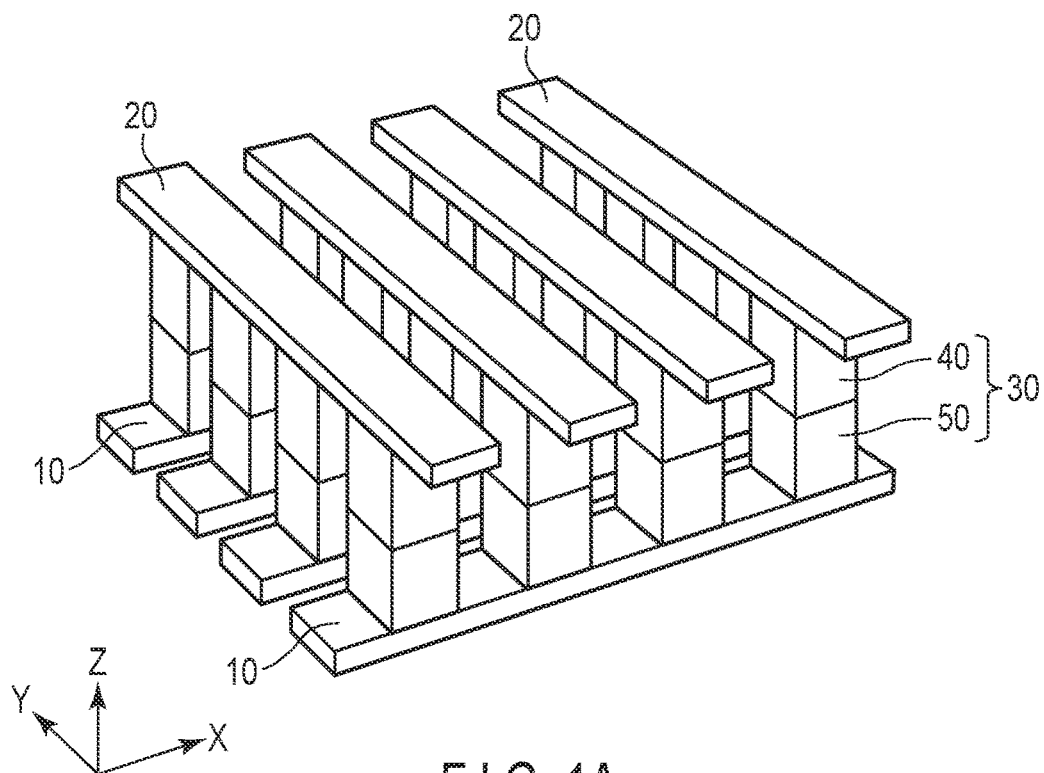
FIG. 1A is a perspective view schematically showing an example of a configuration of a memory device according to an embodiment.

FIG. 1A is a perspective view schematically showing an example of a configuration of a memory device (a nonvolatile memory device) according to an embodiment.

The memory device shown in FIG. 1A includes first wiring lines 10 extending along an X direction, second wiring lines 20 extending along a Y direction and memory cells 30 each provided between the respective first wiring line 10 and the respective second wiring line 20. The first wiring lines 10 corresponds to word lines, respectively and the second wiring lines 20 corresponds to bit lines, or the first wiring lines 10 correspond to bit lines, respectively and the second wiring lines 20 correspond to word lines.

Note that the X, Y and Z directions shown in the figures are directions which intersect each other. More specifically, the X, Y and Z directions are orthogonal to each other.

The memory cells 30 each include a magnetoresistance effect element (a resistance change memory element) 40 and a selector (a switching element) 50 connected in series to the magnetoresistance effect element 40.

Figure 1B:
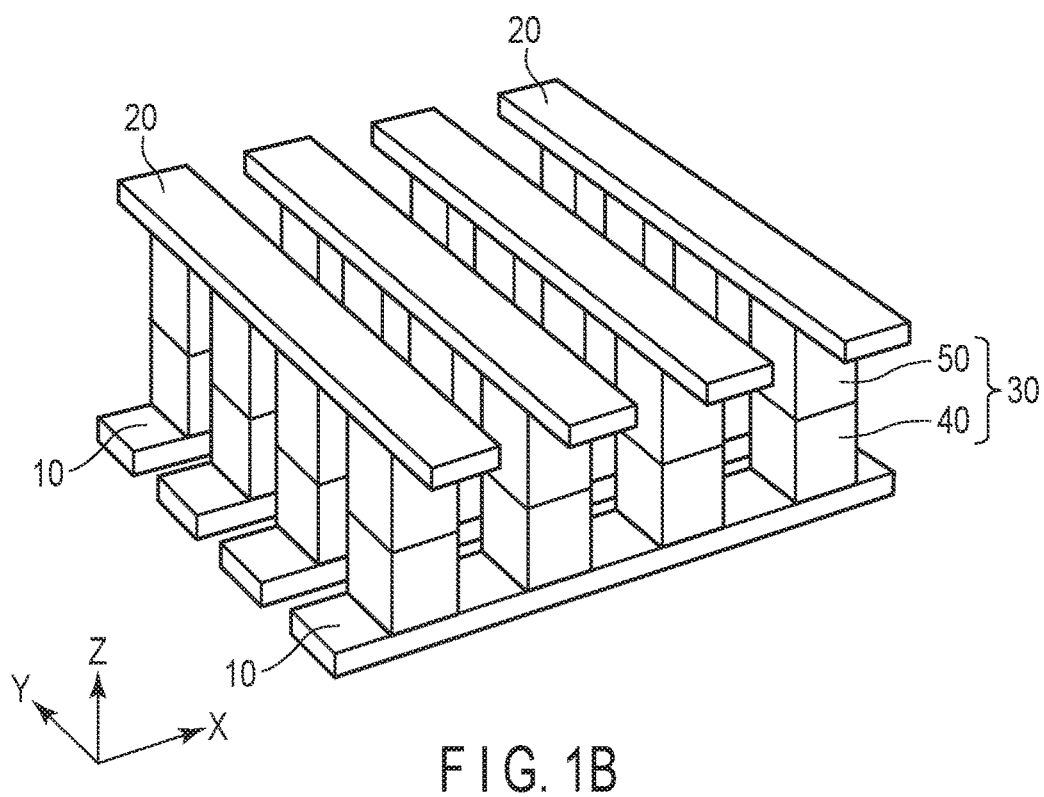
FIG. 1B is a perspective view schematically showing another example of the configuration of the memory device according to the embodiment.

FIG. 1B is a perspective view schematically showing another example of the configuration of the memory device (nonvolatile memory device) according to the embodiment.

In the example shown in FIG. 1A, the magnetoresistance effect element (the resistance change memory element) 40 is located on an upper layer side of the selector (the switching element) 50. But, as shown in FIG. 1B, the magnetoresistance effect element 40 may be located on a lower layer side of the selector 50.

FIG. 2 is a cross-sectional view schematically showing the configuration of the magnetoresistance effect element 40.

The magnetoresistance effect element 40 is a magnetic tunnel junction (MTJ) element and includes a storage layer (a first magnetic layer) 41, a reference layer (a second magnetic layer) 42, a tunnel barrier layer (nonmagnetic layer), a bottom electrode 44 and a top electrode 45.

The storage layer 41 is a ferromagnetic layer having a variable magnetization direction. Here, the variable magnetization direction means that the magnetization direction varies with respect to a predetermined write current. The reference layer 42 is a ferromagnetic layer having a fixed magnetization direction. Here, the fixed magnetization direction means that the magnetization direction does not vary with respect to a predetermined write current. The tunnel barrier layer 43 is an insulating layer provided between the storage layer 41 and the reference layer 42.

When the magnetization direction of the storage layer 41 is parallel to that of the reference layer 42, the magnetoresistance effect element 40 is in a first resistance state (a low-resistance state). When the magnetization direction of the storage layer 41 is antiparallel to that of the reference layer 42, the magnetoresistance effect element 40 is in a second resistance state (a high-resistance state) where the resistance value is higher than that of the first resistance state. With this structure, the magnetoresistance effect element. 40 can store binary data according to the resistance state.

The example shown in FIG. 2 illustrates a bottom-free magnetoresistance effect element in which the storage layer 41 is located on the lower layer side of the reference layer 42, but a top-free magnetoresistance effect element in which the storage layer 41 is located on the upper layer side of the reference layer 42, may as well be used.

FIG. 3 a cross-sectional view schematically showing a configuration of the selector 50.

The selector portion 50 is a 2-terminal switching element and includes a bottom electrode 51, a top electrode 52 and a selector material layer (switching material layer) 53 provided between the bottom electrode 51 and the top electrode 52.

The bottom electrode 51 and the top electrode 52 are each formed from, for example, a titanium nitride (TiN) layer. Of the bottom electrode 51 and the top electrode 52 of the selector 50, the electrode on the side of the magnetoresistance effect element 40 may be shared with either one of the bottom electrode 44 and the top electrode 45, which is located on a selector side, of the magnetoresistance effect element 40.

The selector material layer 53 contains silicon (Si), oxygen (O) and arsenic (As), and at least one predetermined element X selected from lead (Pb), silver (Ag), indium (In), tin (Sn), copper (Cu), zinc (Zn), gallium (Ga), germanium (Ge), selenium (Se), antimony (Sb), tellurium (Te), gold (Au) and bismuth (Bi).

The selector material layer 53 includes an insulating region 53a and a plurality of cluster regions 53b, and each of the cluster regions 53b is surrounded by the insulating region 53a. The insulating region 53a is formed of a silicon oxide ($SiO_2$) containing silicon (Si) and oxygen (O) as its main components. The cluster regions 53b are formed of arsenic (As) clusters containing arsenic (As) as a main component. Adjacent cluster regions 53b are insulated from each other by the insulating region 53a.

In the selector material layer 53, the ratio of As to $SiO_2$ (the ratio of As to $SiO_2$ in number) is about 20%, and the ratio of the predetermined element X to $SiO_2$ (the ratio of the predetermined element X to $SiO_2$ in number) falls in a range from about 1% to about 10%.

Figure 4:
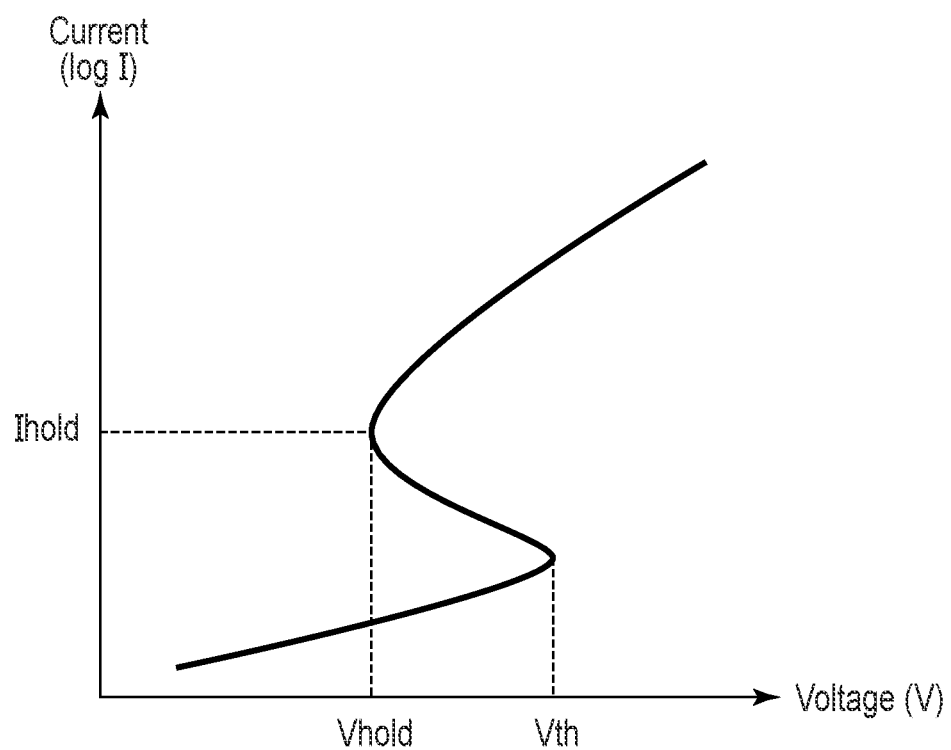
FIG. 4 is a schematic diagram showing current-voltage characteristics of the selector of the memory device of the embodiment.

FIG. 4 is a diagram schematically showing the current-voltage characteristics of the selector 50.

The selector 50 has such characteristics of changing from an off state to an on state when the voltage applied between the bottom electrode 51 and the top electrode 52 is greater than or equal to a predetermined voltage (a threshold voltage Vth). When selector 50 is in the on state, current flows between the bottom electrode 51 and the top electrode 52 of the selector 50 via at least one cluster region 53b. In other words, as electrons move between the bottom electrode 51 and a cluster region 53b, between the top electrode 52 and a cluster region 53b and between cluster regions 53b, current flows in the selector 50.

Therefore, when voltage is applied between the respective first wiring line 10 and the respective second wiring line 20 (see FIG. 1A and FIG. 1B) and the voltage applied between the bottom electrode 51 and the top electrode 52 becomes higher than or equal to the threshold voltage Vth, current flows in the selector 50 and the magnetoresistance effect element 40, thus making it possible to write to or read from the magnetoresistance effect element 40.

Figure 5A:
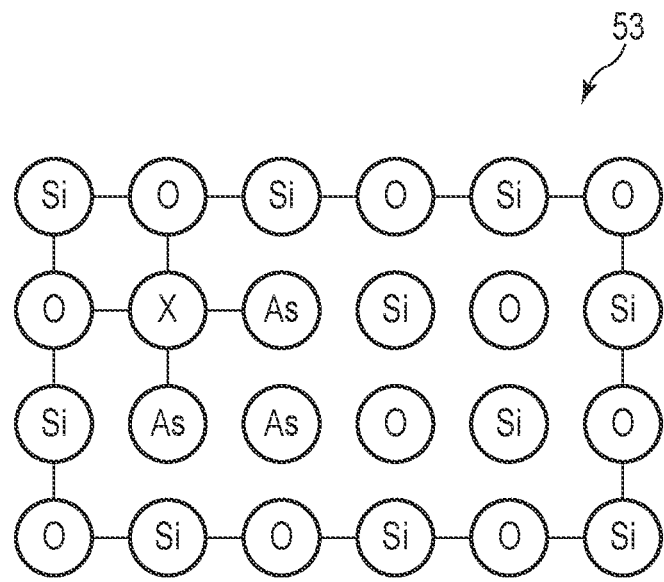
FIG. 5A is a diagram schematically showing an example of an internal configuration of a selector material layer of the memory device according to the embodiment.

FIG. 5A is a diagram schematically showing an example of the internal structure of the selector material layer 53.

The selector material layer 53 contains a silicon oxide layer ($SiO_2$ layer) formed of silicon (Si) and oxygen (O), arsenic (As) clusters and a predetermined element X, and contains a bond of the predetermined element X and arsenic (As) and the bond of the predetermined element X and oxygen (O).

Figure 5B:
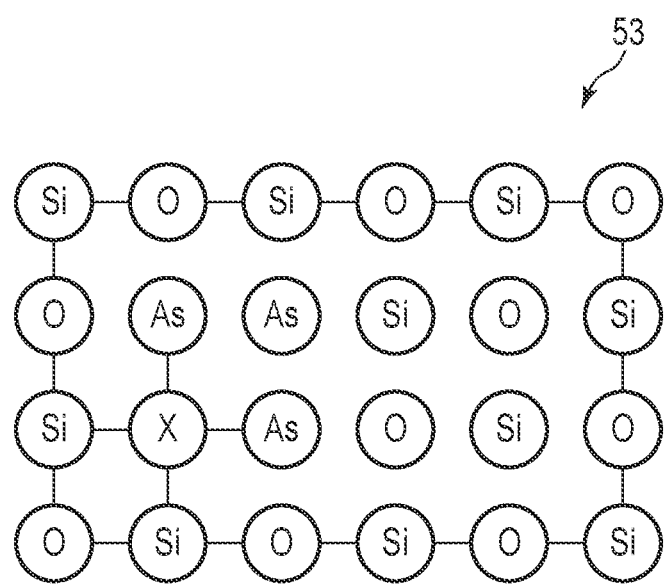
FIG. 5B is a diagram schematically showing another example of the internal configuration of the selector material layer of the memory device according to the embodiment.

FIG. 5B is a diagram schematically showing another example of the internal structure of the selector material layer 53.

As in the case of the example shown in FIG. 5A, the selector material layer 53 contains a silicon oxide layer ($SiO_2$ layer) formed of silicon (Si) and oxygen (O), arsenic (As) clusters, and a predetermined element X, and contains a bond of a predetermined element X and arsenic (As) and a bond of a predetermined element X and silicon (Si).

Note that the selector material layer 53 may contain, in addition to the bond of the predetermined element X and arsenic (As), both of a bond of the predetermined element X and oxygen (O) and a bond of the predetermined element X and silicon (Si).

As described above, in this embodiment, the selector material layer 53 contains silicon (Si), oxygen (O), and arsenic (As), and also a predetermined element X. With this configuration, it is possible to obtain the selector 50 having excellent performance, as described below.

A selector material layer containing silicon (Si), oxygen (O) and arsenic (As), but not containing a predetermined element X has such a drawback that rifting (peeling-off of film) of the selector material layer is likely to occur. As a cause for rifting, the increase in the size of the As clusters is considered. That is, because the bond of As and $SiO_2$ is weak, as the size of the As clusters enlarges, it becomes more difficult for the $SiO_2$ layer to support the As clusters. As a result, rifting may occur due to the As clusters inside the selector material layer.

The cause of increasing of the size of the As clusters is considered to be as follows. In the selector material layer which contains Si, O and As, As changes to the liquid phase when the temperature is at about 310° C. or higher. As a result, As can be easily clustered, thereby generating As clusters having a large size.

In materials containing As and Pb, it is known that a liquid phase is not exhibited until the temperature is about 600° C. or higher. It is also known that materials containing O and Pb do not enter the liquid phase until the temperature is about 600° C. or higher.

Therefore, it is considered that when lead (Pb) is used as the predetermined element X, the bond of As and Pb and the bond of O and Pb are stable up to a temperature of about 600° C. From this, in materials containing silicon (Si), oxygen (O), and arsenic (As), and further lead (Pb) as the predetermined element X, it is considered that the generation of As clusters having a large size is suppressed up to higher temperature.

In materials containing As and Ag, it is known that the liquid phase does not occur until the temperature is about 540° C. or higher in most regions. As to materials containing Si and Ag, it is known that the liquid phase does not occur until the temperature is about 830° C. or higher. From these known facts, it is considered that materials containing silicon (Si), oxygen (O), and arsenic (As) and also silver (Ag) as the predetermined element X are suppressed from forming As clusters with large size up to high temperatures.

As described above, with use of a material containing silicon (Si), oxygen (O)), and arsenic (As) and containing lead (Pb) or silver (Ag) as the predetermined element X for the selector material layer 53, it is possible to reduce the size of the As clusters. For example, the size of the As clusters can be reduced to about 5 nm or less. Thus, rifting caused by large-sized As clusters can be suppressed, and a selector 50 with excellent performance can be obtained.

Note that as the predetermined element X, other elements such as In, Sn, Cu, Zn, Ga, Ge, Se, Sb, Te, Au or Bi can be used, in addition to Pb and Ag mentioned above. These elements are located close to Pb, Ag or As, or between Pb and Ag in the periodic table.

Therefore, these elements, as in the case of Pb and Ag, are also considered to be able to reduce the size of the As clusters.

Next, methods of forming the selector material layer 53 will be described. As will be set our below, several methods can be employed to form the selector material layer 53.

In the first method, a silicon oxide layer ($SiO_X$ layer) is first formed. Then, a predetermined element X and As are introduced to the silicon oxide layer by ion implantation. Here, the predetermined element X may be ion-implanted after As is ion-implanted, or As may be ion-implanted after the predetermined element X is ion-implanted.

In the second method, a silicon oxide layer ($SiO_X$ layer) is first formed. Then, a layer of the predetermined element X (X layer) is formed on the silicon oxide layer. After that, As is ion-implanted to the silicon oxide layer through the X layer. Further, the predetermined element X is diffused from the X layer into the silicon oxide layer.

In the third method, a silicon oxide layer ($SiO_X$ layer) containing the predetermined element X is first formed. More specifically, a silicon oxide layer containing the predetermined element X is formed by sputtering using a target of silicon oxide and a target of the predetermined element X. Alternatively, a silicon oxide target containing the predetermined element X is used to form a silicon oxide layer containing the predetermined element X by sputtering. Then, As is introduced into the silicon oxide layer containing the predetermined element X by ion implantation of As.

In the fourth method, first, silicon oxide layers ($SiO_X$ layers) and layers (X layers) of the predetermined element X are alternately stacked one on another. Then, by heat, the predetermined elements X are diffused from the X layers into the silicon oxide layers. Then, As is introduced into the silicon oxide layers containing the predetermined element X by ion implantation of As.

In the fifth method, with use of a target of a silicon oxide ($SiO_X$) containing As and the prescribed element X, a silicon oxide layer containing As and predetermined element X is formed by sputtering.

As described above, the selector material layer 53 can be formed by various methods.

Note that in the embodiment described above, a magnetoresistance effect element was used as the resistance change memory element, but some other resistance change memory element such as a phase change memory (PCM) element, for example, can as well be used.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A switching element comprising:
   a first electrode;
   a second electrode; and
   a switching material layer provided between the first electrode and the second electrode,
   wherein
   the switching material layer contains silicon (Si), oxygen (O), arsenic (As), and a predetermined element selected from lead (Pb), silver (Ag), indium (In), tin (Sn), copper (Cu), zinc (Zn), gallium (Ga), germanium (Ge), selenium (Se), antimony (Sb), tellurium (Te), gold (Au) and bismuth (Bi),
   arsenic (As) contained in the switching material layer forms a plurality of cluster regions, and
   silicon (Si) and oxygen (O) contained in the switching material layer form an insulating region.

2. The switching element of claim 1, wherein each of the plurality of cluster regions is surrounded by the insulating region.

3. The switching element of claim 1, wherein the switching material layer contains a bond of the predetermined element and arsenic (As).

4. The switching element of claim 3, wherein the switching material layer contains a bond of the predetermined element and oxygen (O).

5. The switching element of claim 3, wherein the switching material layer contains a bond of the predetermined element and silicon (Si).

6. The switching element of claim 1, wherein the switching element changes from an off state to an on state when a voltage applied between the first electrode and the second electrode is greater than or equal to a predetermined voltage.

7. The switching element of claim 1, wherein current flows between the first electrode and the second electrode via at least one of the cluster regions when the switching element is in an on state.

8. A memory device comprising:
   the switching element of claim 1; and
   a resistance change memory element provided on an upper or lower layer side of the switching element,
   wherein:
   the resistance change memory element is connected in series to the switching element and has a first resistance state and a second resistance state, and
   the second resistance state has a higher resistance value than a resistance value of the first resistance state.

9. The memory device of claim 8, wherein the resistance change memory element is a magnetoresistance effect element.

10. The memory device of claim 8, further comprising:
    a first wiring line extending in a first direction; and
    a second wiring line extending in a second direction intersecting the first direction,
    wherein the switching element and the resistance change memory element are provided between the first wiring line and the second wiring line.

* * * * *